United States Patent [19]

Imanaka

[11] Patent Number: 5,407,730
[45] Date of Patent: Apr. 18, 1995

[54] PHYSICAL VARIABLE SENSOR AND METHOD OF MANUFACTURING THE SAME

[75] Inventor: Koichi Imanaka, Tsukuba, Japan

[73] Assignee: Omron Corporation, Kyoto, Japan

[21] Appl. No.: 95,320

[22] Filed: Jul. 22, 1993

[30] Foreign Application Priority Data

Jul. 24, 1992 [JP] Japan .................................. 4-218242

[51] Int. Cl.⁶ .............................................. B32B 9/00
[52] U.S. Cl. .................................... 428/209; 428/210; 428/901
[58] Field of Search ......................... 428/209, 210, 901

[56] References Cited

U.S. PATENT DOCUMENTS

| | | | |
|---|---|---|---|
| 4,373,386 | 2/1983 | Schuddemat et al. | 73/189 |
| 4,706,061 | 11/1987 | Johnson | 338/3 X |
| 4,935,289 | 6/1990 | Kikuchi et al. | 428/209 |
| 5,041,187 | 8/1991 | Hink et al. | 156/63 X |

Primary Examiner—Patrick J. Ryan
Assistant Examiner—Kam F. Lee
Attorney, Agent, or Firm—William L. Klima

[57] ABSTRACT

A physical variable sensor with a processor circuit that can be used for any of a number of different applications. The variable sensor is compact and inexpensive to produce. The variable sensor comprises first, second and third substrates. On the second substrate is mounted a sensor component and a first processor circuit to convert the output of the sensor component to a standard electrical signal. A second processor circuit is provided on the third substrate. The second processor circuit includes an amplifier circuit, a digital fuzzy microprocessor and a luminous element to transmit an optical signal to the exterior. A solar cell can be provided on the first substrate to supply energy to the circuits. The first and third substrates are common to all types of sensors, and by modifying the second substrate different sensors to measure different types of variables can be produced.

23 Claims, 3 Drawing Sheets

PHYSICAL VARIABLE SENSOR AND METHOD OF MANUFACTURING THE SAME

FIELD OF THE INVENTION

This invention relates to a physical variable sensor, and the method by which it is manufactured. More specifically, it relates to a sensor for use in industrial equipment, information processing devices and home appliances which can detect and measure such physical variables as light, pressure, acceleration, temperature, or humidity, and the method by which it is manufactured.

BACKGROUND OF THE INVENTION

Heretofore, many kinds of sensors have been developed. Typical are sensors which can detect such variables as light, pressure, stress, position, distance, acceleration, temperature, humidity, hardness, shape, vibration (frequency), weight, rate of flow, quantity of gas, type of gas, quantity of electromagnetic energy, odor, or changes in such variables. Generally, these physical variable sensors consist of a sensor component to detect the physical variable and an electrical processor circuit component to electrically transform the output of the sensor component. The structural components of a physical variable sensor are enclosed in a case, and connections within the case are made with electrical wiring such as vinyl insulated cable. With this type of existing sensor, it is difficult to downsize the individual components and interconnect components with the existing wiring process, and the sensor component itself must be kept relatively large.

Furthermore, existing sensors require a different type of sensor component for each variable to be detected. Different types of outputs are produced by the sensor component including voltage, current, power, charge, resistance, or degree of change in these variables. Such sensors process each type of output with a dedicated circuit to measure each different variable.

As examples of existing physical variable sensors, consider a temperature sensor using a thermocouple and a light sensor using a photodiode. In the temperature sensor, the electromotive force generated in the thermocouple by temperature variation is processed by an electrical circuit so that it can be outputted as temperature. In the light sensor, light striking the photodiode generates a photocurrent, which is processed by an electrical circuit to detect the intensity of light, or the presence, position, or shape of an object. As can be understood from these examples, different types of sensors require different dedicated processor circuits. To design and build a dedicated processor circuit for each type of sensor, increases the production cost. Furthermore, the requirement for dedicated processor circuits prevents producing a multi-function sensor which can detect data relating to a number of different variables.

SUMMARY OF THE INVENTION

In light of the problems observed among existing sensors, the objective of this invention is to realize a single processor circuit which could be shared by all the various functions. This would enable the production of a compact, economically priced physical variable sensor.

The physical variable sensor of this invention comprises a first substrate forming a surface substrate; a second substrate forming a sensor substrate having a sensor component which changes the physical variable measured into the corresponding kind of electrical signal and a first electrical processor circuit which changes the electrical signal outputted by the aforementioned sensor component into a specified type of electrical signal; and a third substrate forming a second electrical processor circuit which outputs the aforementioned specified type of electrical signal as a particular quantity of an electrical property. The three substrates are stacked so that the second substrate is sandwiched between the first and third substrates, and are electrically connected so that the output of the second substrate serves as input to the third substrate.

In these sensor devices, the second substrate can be comprised of multiple layers of substrates stacked one on top of the other, each with its own sensor component and processor circuit, and each electrically connected to the third substrate.

As the sensor component is located between the first and third substrates in this type of sensor, an opening in the first substrate must be provided in the location corresponding to the sensor component to enable the sensor component to measure an external object without difficulty.

If the second substrate has two or more sensor components, it will be possible to switch into various types of outputs. A switching device such as a relay or switching circuit can be provided on the third substrate to switch the two or more outputs to a single output. The output of this switching device can be connected to the second processing circuit. In this way the two or more electrical outputs from the second substrate to the third substrate can be inputted discretely to the aforementioned switching device. In this manner the switching device can be switched using a timing circuit and time sharing in response to a signal from an external controller.

For the electrical connection(s) between the substrates, any of a number of different arrangements can be chosen. The substrates may be connected via the engagement of a male and female electrode, via a conductive polymer, or via optical signals transmitted between an electro-optical converter element and a photoelectric converter element.

The drive energy for the sensor can be supplied by a solar cell on the first substrate or by a small battery. Alternatively, microwave signals received from an external microwave source can be converted to electrical power by a converter.

Signals from the sensor (electrical quantities) can be outputted in an appropriate manner through electrical wiring, or can be transmitted through the air to an external controller.

The substrates can be made of a semi-conductive material such as a single crystal or polycrystal semi-conductor, or of a ceramic material.

The scheme introduced by this invention to manufacture a physical variable sensor allows a number of sensors to be produced by a single process. The first, second and third mother substrates, each of which consists of a number of substrate layers mentioned above, are stacked so that the second substrate is sandwiched between the first and third substrates. This assembled substrate sandwich is then cut into sections to produce a number of discrete physical variable sensors.

The physical variable sensor of this invention has a first electrical processor circuit to transform the electrical quantity output by the sensor component into a standard form. No matter what type of electrical quantity is outputted by the sensor component, the first electrical processor can output the data in a standard form as an electrical quantity. Thus, even in a system where a number of different types of sensor components are used simultaneously, or when different sensor components are used separately, the various outputs of the different sensor components can be sent to the second electrical processor circuit in a standardized form, so that the same second processor circuit can perform all the necessary processing.

Because the sensor is constructed by stacking the first substrate, the second substrate with its sensor component, and the third substrate with its processor circuit there is no need to use cable to connect the sensor component to any of the processor circuits. Because cable connections are not needed, the sensor can be miniaturized.

Also, advantages are provided with the sensor component and the first electrical processor circuit which transforms the output of the sensor component into a standard electrical form being mounted on a single substrate (i.e. the second substrate); and the second electrical processor circuit, which processes the standardized electrical quantity comprising a separate substrate (i.e. the third substrate). This design, therefore, allows the first and third substrates to serve for all applications, so that replacing only the second substrate will create each of the various sensor types desired. Designing the first and third substrates so that they can be used with any type of sensor makes mass production more efficient, and drives down the cost of the sensor. It also reduces the portion of the assembly cost which is due to the wiring.

The production scheme for making a sensor according to the present invention involves manufacturing the physical variable sensor described above. Mother substrates containing a number of physical variable sensors mentioned above are stacked together, and the substrate sandwich is cut into numerous pieces each with a physical variable sensor. This allows a number of sensors to be produced simultaneously in a single production process, thereby improving the efficiency of the production process for the aforesaid sensors.

BRIEF DESCRIPTION OF THE INVENTION

DETAILED DESCRIPTION OF PREFERRED EMBODIMENTS

Figure 1:
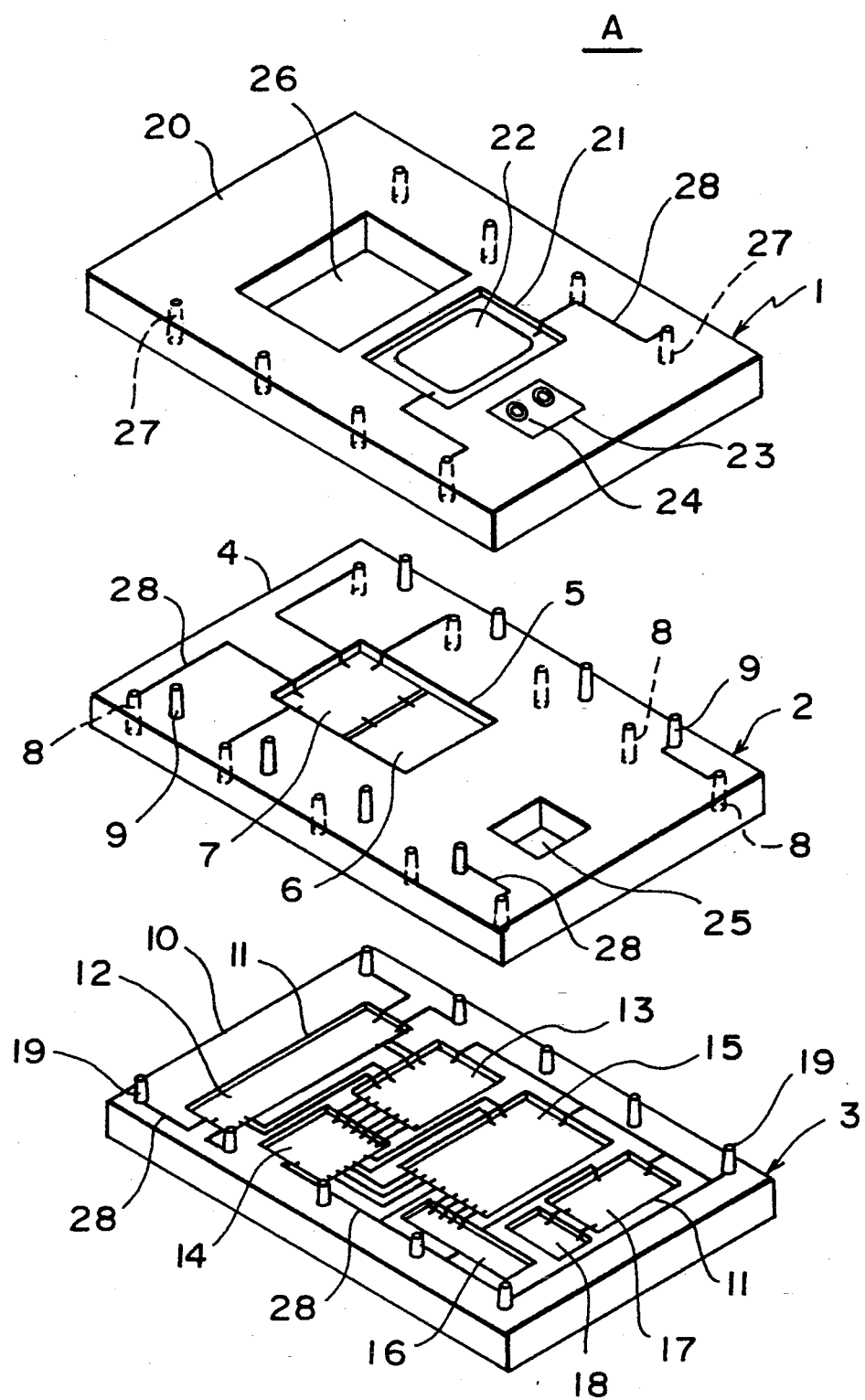
FIG. 1 is an exploded perspective view of the physical variable sensor of a first embodiment according to the present invention.

FIG. 1 is an exploded perspective view of physical variable sensor A. Sensor A comprises surface substrate 1 (i.e. first substrate), sensor substrate 2 (i.e. second substrate), and processor circuit substrate 3 (i.e. third substrate).

The sensor substrate 2 is formed from a highly resistant silicon substrate 4, provided with a depression 5 on its upper surface. Inlaid in depression 5 is sensor component 6, which transforms the variable quantity detected into a characteristic electrical signal (i.e. an electrical quantity); and first processor circuit 7, which transforms the characteristic electrical signal output by the aforesaid sensor component 6 into a standard electrical signal. This standard electrical signal is outputted from the aforesaid first processor circuit 7 to contact holes 8 on the bottom of the silicon substrate 4, regardless of the type of sensor component 6 producing the original signal. Types of variables which can be detected by the sensor component 6 and converted into an electrical signal include light, pressure, stress, position, distance, speed, acceleration, temperature, humidity, hardness, shape, vibration (frequency), weight, rate of flow, quantity of gas, type of gas, quantity of electromagnetic energy (i.e. strength), and odor. The characteristic electrical signal outputted by sensor component 6 will also vary according to what type of sensor component 6 is employed. This signal may take the form of voltage, current, power, charge, resistance, or rate of change of these variables. The signal output by first processor circuit 7 is standardized no matter what type of signal is outputted by sensor component 6. For example, a single signal type, (e.g. voltage signal) is outputted by first processor circuit 7. To supplement the aforementioned contact holes 8, a number of additional contact holes 8 (e.g. through holes) are provided on both sides of the bottom surface of sensor substrate 2 to insure that the substrates are electrically connected to each other. On both sides of the upper surface of the sensor substrate 2, a number of contact posts 9 (e.g. cylindrical protuberances) are provided which engage with contact holes 8 to electrically connect the substrates.

Processor circuit substrate 3 has its circuitry embedded in depression 11 on the upper surface of a highly resistant silicon substrate 10. To connect it electrically with sensor substrate 2, the processor circuit substrate 3 has a number of contact posts 19 on both sides of its upper surface. The silicon substrate 10 is provided with the following components, including: amplifier circuit 12, which amplifies the standardized electrical signal input by sensor substrate 2 via contact holes 8; waveform shaping circuit 13, which shapes the amplified signal output by amplifier circuit 12; A/D converter circuit 14, which converts the analog signal output by shaping circuit 13 to a digital signal; digital fuzzy microprocessor 15, which receives the digital signal output by converter circuit 14 and performs fuzzy calculations, judgments and control processes on the signal; interface circuit 16, which converts the signal outputted by microprocessor 15 into a signal which can be outputted to the exterior of the device; luminous element 18 such as a light emitting diode to transmit an optical signal to the exterior; and drive circuit 17 (e.g. a power FET or the like) which receives the signal output by the aforementioned interface circuit 16 and generates a drive current to switch luminous element 18 on and off. The connections among the various circuits and elements on sensor substrate 2 and processor circuit substrate 3 and the connections between contact holes 8 and contact posts 9 and 19 are made by means of metal wiring 28 using aluminum wire or a similar substance.

The surface substrate 1 is provided with a depression 21 on the upper surface of a highly resistant silicon substrate 20 in which is embedded solar cell 22. The electrical energy generated by solar cell 22 is supplied to shaping circuit 13, A/D converter circuit 14, digital fuzzy microprocessor 15 and other circuits via metal wiring 28 and the engagement of contact holes 27 and 8 with contact posts 9 and 19, respectively. In the silicon substrate 20, at a location which corresponds to that of sensor component 6 on sensor substrate 2, is a sensor hole 26 for measuring the variable. This enables sensor component 6 to come in contact with the external variable to be measured and detect it easily.

In sensor substrate 2 and surface substrate 1, in the locations corresponding to that of luminous element 18 on processor circuit substrate 3, are openings 25 and 23, respectively. In opening 23 on substrate 1 is positioned a condenser 24 such a micro-Fresnel lens or the like. The optical signal output by luminous element 18 is emitted to the exterior as focused light consisting of nearly parallel beams, so it can be transmitted over a long distance.

The surface substrate 1, sensor substrate 2 and processor circuit substrate 3 are stacked in the order shown in FIG. 1, and are fixed to each other by means of an adhesive, for example, a compound of the fiber glass resin family. The substrates are electrically connected to each other through the engagement of contact posts 9 and 19 with contact holes 8 and 27. At the same time, this system insures that each substrate is positioned accurately with respect to the contiguous substrate. The contact posts 9 and 19 and contact holes 8 and 27 may be simply placed in physical contact with each other, or they may be glued together using, for example, a conductive polymer.

A specific embodiment of the aforesaid variable sensor A in which the variable to be measured is pressure will now be discussed in detail. In this application, a diaphragm-type pressure sensor is used as the sensor component 6. This type of sensor outputs the value of the pressure as the capacitance across a minute gap in a built-in capacitor. The capacitance output by sensor component 6 is converted to voltage by processor circuit 7 and outputted as a voltage signal. This voltage signal is conducted, via metal wiring 28, to amplifier circuit 12 located on substrate 3, where it is amplified. The signal is shaped in shaping circuit 13 by having its noise filtered and so on, and digitized by A/D converter circuit 14. In the digital fuzzy microprocessor 15, a judgment such as "voltage is slightly high" is rendered. The judgment output is converted to the appropriate PCM (pulse code modulation) signal by interface circuit 16. This PCM signal then serves as the trigger to drive circuit 17, which causes luminous element 18 to light up. An optical PCM signal is transmitted to an external controller (not shown).

Semi-conductor production technology can be utilized to make a variable sensor A with this type of design, having various circuits, sensor component 6, luminous element 18 and the other components on a silicon substrate. This allows the mass production of an accurate ultra-miniature variable sensor A at low cost. Stacking the three substrates, surface substrate 1, sensor substrate 2 and processor circuit substrate 3, allows each to be electrically connected to the next via contact holes 8 and 27 and contact posts 9 and 19. This connection can be made without the use of cable, thus simplifying the wiring procedure and contributing to the miniaturization of variable sensor A.

To produce various kinds of sensors A (for example, a pressure sensor, an acceleration sensor and a temperature sensor), different sensor components 6 are required. However, because the electrical signal output by sensor substrate 2 is standardized, these different sensors can all use the same processor circuit substrate 3 and surface substrate 1. Thus, only the various kinds of sensor substrates 2 need be manufactured separately. This results in a low production cost even with a variety of types of sensor A.

Figure 2:
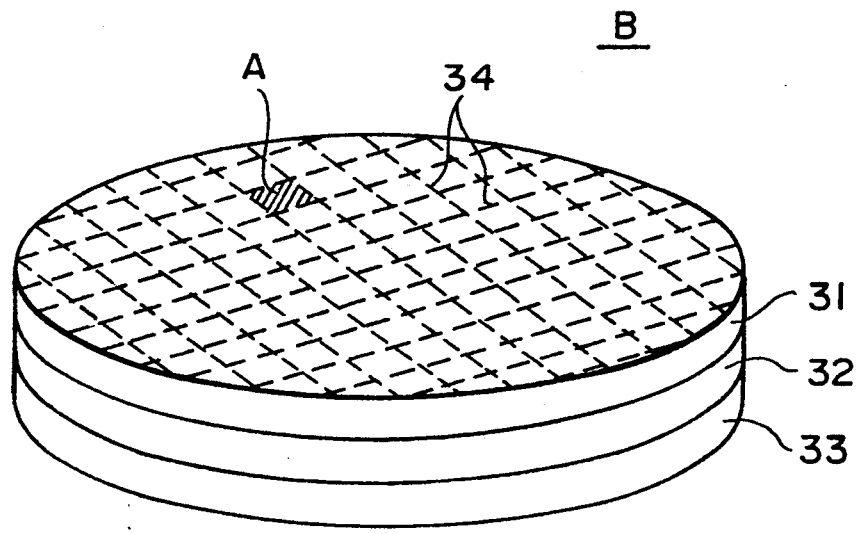
FIG. 2 is a perspective view of an assembled stack of mother substrates (e.g. or wafers) used to construct the physical variable sensors.

FIG. 2 shows a perspective view of an intermediate point in the production process used to manufacture the aforesaid variable sensor A. A first mother substrate 31 is formed by laying a number of surface substrates 1 on a silicon wafer (e.g. a four-inch wafer). A second mother substrate 32 is formed by laying a number of sensor substrates 2 on a silicon wafer. A third mother substrate 33 is formed by laying a number of processor circuit substrates 3 on a silicon wafer. The mother substrates 31, 32 and 33 are aligned with each other and stacked to form mother substrate laminate B, which may be fixed together with an adhesive. This laminate is then cut with a dicing cutter along dotted lines 34 (i.e. dicing lines) shown in FIG. 2 to produce a number of discrete variable sensors A. The shaded area in FIG. 2 is a single variable sensor A.

It is possible to manufacture variable sensors A individually, as shown in FIG. 1 however, if a number of sensors A are produced as shown in FIG. 2 and then cut apart, a number of surface substrates 1, sensor substrates 2 and processor circuit substrates 3 can be manufactured simultaneously. This significantly reduces the number of process steps to stacking and gluing the substrates and cutting them apart, thereby greatly simplifying the production of these sensors. The ability to perform a number of tasks simultaneously also lowers the cost.

Figure 3:
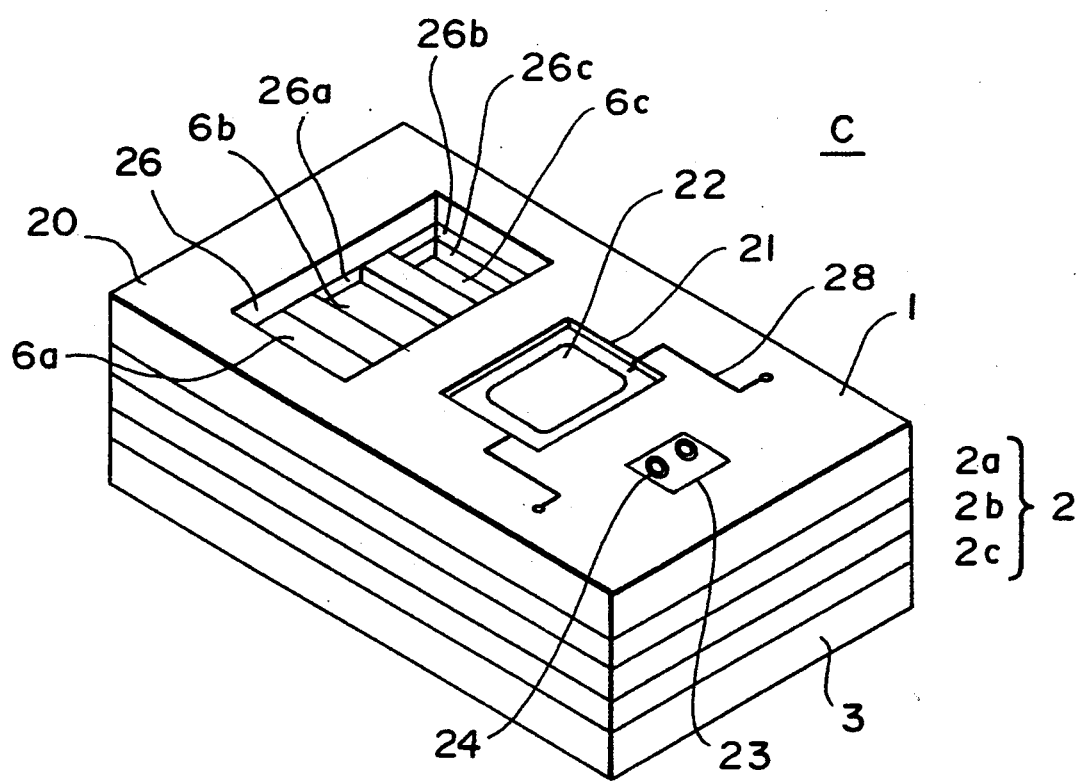
FIG. 3 is a perspective view of another embodiment of the physical variable sensor according to the present invention.

FIG. 3 is a perspective view of variable sensor C, another sensor incorporating the principles of this invention. In this embodiment, sensor substrate 2 comprises multiple constituent substrate layers 2a, 2b, and 2c. On each constituent layer is one of the different sensor components 6a, 6b, and 6c, and dedicated processor circuits 7a, 7b, and 7c, to convert the output from the sensor components 6a, 6b, and 6c to a standard electrical signal. The sensor components 6a, 6b, and 6c are staggered on constituent layers 2a, 2b, and 2c so that they do not overlap. Openings 26, 26a, 26b, and 26c are provided on each of the constituent substrate layers and on surface substrate 1 so that the sensor component below that layer will be exposed to the exterior.

Figure 4:
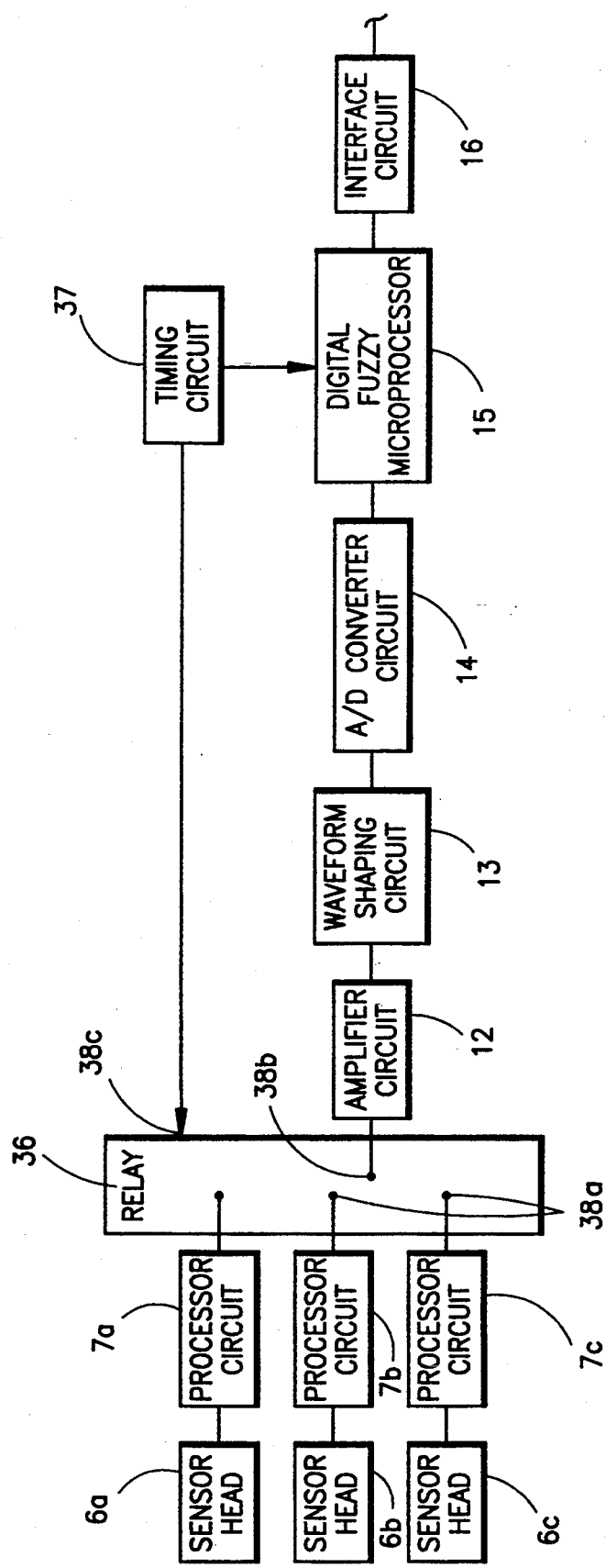
FIG. 4 is a block diagram of the sensor shown in FIG. 3.

The processor circuit substrate 3 is common to all sensors, so the same substrate 3 can be used with the different kinds of constituent substrate layers 2a, 2b, and 2c. However, for an electrical signal representing a number of measured variables to be transmitted by sensor substrate 2 as a standard signal, a switching device will be required to switch between the various electrical signals and processor circuit substrate 3. For this purpose, relay (i.e. switching circuit) 36 and timing circuit 37 are provided. As can be seen in FIG. 4, the standard electrical signal from sensor substrate 2 is inputted into amplifier circuit 12 via switching circuit 36.

The switching circuit 36 has multiple input terminals 38a, a single output terminal 38b and a clock terminal 38c. The outputs from the various substrate layers 2a, 2b, and 2c are connected to input terminals 38a on switching circuit 36, and output terminal 38b is connected to amplifier circuit 12. The switching circuit 36 and digital fuzzy microprocessor 15 perform time sharing control using timing circuit 37, which accomplishes time control at fixed intervals. Input terminals 38a on switching circuit 36 are normally connected to the single output terminal 38b. The timing signal from timing circuit 37, which is inputted into clock terminal 38c, causes output terminal 38b to be switched back and forth among input terminals 38a at fixed intervals of ΔT. This causes the electrical signal inputted into digital fuzzy microprocessor 15 to change, at fixed intervals of ΔT, from a representation of the physical data detected by sensor component 8a to a representation of the data detected by sensor component 8b, and 8c. With the aid of a timing signal from timing circuit 37, microprocessor 15 makes a judgment as to which sensor component detected the data represented by the signal it had just received. It performs the processing appropriate to that sort of physical data and outputs a signal.

The physical variable sensor C with a single processor circuit substrate 3 can simultaneously process signals outputted by a number of sensor components 6a, 6b, and 6c each of which detects different physical data. In other words, this configuration provides a multi-function sensor. In this embodiment, the constituent substrates 2a, 2b, and 2c can be combined in different ways to produce sensors which combine various sets of functions.

In the circuit layout shown in FIG. 4, switching circuit 36 is switched by timing circuit 37 to time-share the physical data detected by sensor components 6a, 6b, and 6c on substrate layers 2a, 2b, and 2c. It is also possible to control switching circuit 36 in some other manner. For example, switching circuit 36 can be switched when a signal from an external controller is received by a receiving device (not shown). In this way, the type of variable data outputted by the sensor can be switched by the external controller. This controller can use an optical signal, which can be received by a light receiving element on surface substrate 1. The switching circuit 36 can then be controlled in response to this signal.

Other configurations for the implementation of this invention will now be discussed. The electrical connection between the substrates, for example, need not be accomplished through the engagement of contact posts in contact holes as in the embodiment discussed above. The substrates can alternatively be electrically connected by means of electrodes on opposite substrate surfaces which are joined via a conductive polymer. Another alternative would be for one substrate to have an electro-optical converter element to change the electrical signal into an optical signal. This optical signal can then be emitted by a luminous element on that same substrate and received by a light receiving element on the other substrate. The optical signal which is received would then be reconverted to its original form of an electrical signal by a photo-electric converter element on the receiving substrate.

As an alternative to supplying energy to the sensor via a solar cell, power could be supplied from an external source via a cable. As another alternative, one of the substrates (e.g. surface substrate 1) can have a small replaceable battery mounted on it. A further alternative would be for one of the substrates to have a microwave receiver circuit. Microwaves received by this circuit could be converted to DC current by a converter (e.g. AC/DC converter circuit), and supplied to the various circuit components. If a solar cell is used, it is not imperative that it be placed on the surface substrate. It can also be placed on the processor circuit substrate 3 as long as windows were provided in the surface substrate 1 and sensor substrate 2 to allow the light to pass therethrough.

In the embodiment discussed above, the output signal from the variable sensor is an optical signal from a luminous element. The output signal could also take the form of a microwave signal outputted by a microwave oscillator.

Instead of the digital fuzzy microprocessor mentioned above, a neuro-microprocessor could be used which has neuro-computing and neuro-learning capabilities.

In the embodiment discussed above, the various substrate layers are formed from silicon substrates, however, it would be possible to use substrates comprising a semi-conductive material other than silicon, such as a single crystal or polycrystal semiconductor. Ceramic substrates can also be used.

The physical variable sensor of this invention outputs all data as a standard electrical signal no matter what type of signal is outputted by the sensor component. When a number of different types of sensor components are used simultaneously or at different times, the output to the second processor circuit will be in the standard form of a single, common electrical quantity. Thus the second processor circuit can be used in any type of sensor, thereby reducing the production cost. The physical variable sensor is formed by stacking the first substrate 1, second substrate 2 with the sensor component and third substrate 3 with the processor circuit. Thus there is no need for a cable to connect the sensor component with the various processor circuits. This allows the sensor to be ultra-miniaturized. The application of semi-conductor production technology in the manufacturing process not only results in an ultra-miniature variable sensor, but also reduces the cost of mass production.

The second substrate comprises both the sensor component and the first processor circuit which converts the output of that sensor component to a standard electrical form. The second processor circuit, which handles this standardized electrical quantity is on the third substrate. Since both the first and third substrates are common to all sensors, any of the various types of sensors can be produced merely by replacing the second substrate. Mass production of sensors featuring the same first and third substrates will result in a lower production cost. A further cost reduction results from the elimination of the wiring process.

When a number of sensor components are to be mounted in a single sensor, the second substrate can be formed by stacking a number of substrate layers each of which has a sensor component. This arrangement will achieve a compact multi-function sensor. In addition, by varying the combination of substrate layers the combination of sensor functions can easily be varied.

The production scheme for making a sensor according to the present invention involves manufacturing the physical variable sensor described above. The mother substrates containing a number of physical variable sensors are stacked together, and the assembled mother substrate sandwich is then cut into numerous pieces to produce a number of physical variable sensors. This allows a number of sensors to be produced simultaneously in a single production process, thereby improving the efficiency of the production process for the aforesaid sensors.

What is claimed is:

1. A physical variable sensor, comprising:

a first substrate forming a surface substrate;
a second substrate forming a sensor substrate, said sensor substrate, comprising:
   a sensor component which converts a physical variable measured into a characteristic electrical signal; and
   a first electrical processor circuit which converts said characteristic electrical signal output from said sensor component into a compatible electrical signal; and
a third substrate forming an electrical processor circuit substrate, said electrical circuit substrate including a second electrical processor circuit which converts said compatible electrical signal into a specific electrical property, said first, second and third substrates are stacked and connected electrically to each other and said second and third substrates are connected together so that said output signal of said second substrate serves as an input signal to said third substrate.

2. A physical variable sensor as claimed in claim 1, wherein said first, second and third substrates are stacked in a form that said second substrate is sandwiched between said first and third substrates.

3. A physical variable sensor as claimed in claim 1, wherein said first, second and third substrates are stacked in a form that said third substrate is sandwiched between said first and second substrates.

4. A physical variable sensor as claimed in claim 2, wherein said first substrate has an opening at a corresponding location of said sensor component mounted on said second substrate through which the external physical variable can be measured.

5. A physical variable sensor as claimed in claim 1, wherein said electrical connection between said first, second and third substrates is accomplished by the engagement of a male electrode on one substrate with a female electrode on the other substrate.

6. A physical variable sensor as claimed in claim 1, wherein said electrical connection between said first, second and third substrates is accomplished by means of pathways comprising a conductive polymer.

7. A physical variable sensor as claimed in claim 1, wherein said electrical connection between said first, second and third substrates is accomplished by means of optical signals sent by an electro-optical converter element on one substrate to a photo-electric converter element on the other substrate.

8. A physical variable sensor as claimed in claim 1, wherein said first substrate comprises a solar cell on said first substrate to supply driving energy.

9. A physical variable sensor as claimed in claim 1, wherein a battery is supplied on either said first or said second substrates to supply driving energy.

10. A physical variable sensor as claimed in claim 1, wherein said first or second substrate comprises an electrical converter on either said first or said second substrate to supply driving energy, and said electrical converter receives microwave signals and converts said microwave signals into electric power.

11. A physical variable sensor as claimed in claim 1, further comprising a transmission device to transmit to an external controller said specific electrical property outputted from said third substrate.

12. A physical variable sensor as claimed in claim 11, wherein said transmission device is a wireless device.

13. A physical variable sensor as claimed in claim 1, wherein each of said first, second and third substrates comprises a semi-conductive material selected from the group consisting of a single crystal and polycrystal semi-conductor.

14. A physical variable sensor as claimed in claim 1, wherein each of said first, second and third substrates comprises a ceramic material.

15. A physical variable sensor as claimed in claim 1, wherein said second substrate comprises a plurality of stacked constituent substrates each having a different sensor component, and said first electrical processor circuit electrically connects said constituent substrate to said third substrate.

16. A physical variable sensor as claimed in claim 15, wherein said first, second and third substrates are stacked in a form that said second substrate is sandwiched between said first and third substrate.

17. A physical variable sensor as claimed in claim 16, wherein said first substrate and said constituent substrates have an opening at a corresponding location of said sensor component mounted on an adjacent lower constituent substrate through which the external physical variable can be measured.

18. A physical variable sensor as claimed in claim 15, wherein said third substrate further comprises a switching circuit to switch two or more electrical signals from two or more sensor components, and output a single electrical signal as an input to said second electrical processor circuit.

19. A physical variable sensor as claimed in claim 18, wherein said switching circuit includes a timing circuit, and detects individual measurements by applying time sharing to said two or more electric signals from said two or more sensor components.

20. A physical variable sensor as claimed in claim 18, wherein said switching circuit further comprises a control receiving device to receive a control signal from an external controller to switch said two or more electric signals so that a desired physical variable can be selected.

21. A physical variable sensor as claimed in claim 15, further comprising a transmission device to transmit to an external controller, an electrical property outputted from said third substrate.

22. A physical variable sensor as claimed in claim 21, wherein said transmission device is a wireless device.

23. A physical variable sensor, comprising:
   a surface substrate;
   a sensor substrate connected to said surface substrate, said sensor substrate including at least one sensor component and a first processor circuit receiving input from said at least one sensor component;
   a processor substrate connected to said sensor substrate, said processor substrate including a second processor circuit receiving input from said first processor circuit; and
   a power source for driving said circuits,
   wherein said sensor substrate can be substituted with another sensor substrate having at least one different sensor component for converting the physical variable sensor to detect a different physical property.

* * * * *